US008481339B2

(12) United States Patent
Nagahara et al.

(10) Patent No.: US 8,481,339 B2
(45) Date of Patent: Jul. 9, 2013

(54) MAGNETIC MEMORY AND MANUFACTURING METHOD THEREOF

(75) Inventors: Kiyokazu Nagahara, Kanagawa (JP); Eiji Kariyada, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/360,599

(22) Filed: Jan. 27, 2012

(65) Prior Publication Data

US 2012/0211811 A1    Aug. 23, 2012

(30) Foreign Application Priority Data

Feb. 22, 2011   (JP) .................................. 2011-035757

(51) Int. Cl.
*H01L 21/00*   (2006.01)
(52) U.S. Cl.
USPC ................ 438/3; 438/239; 257/295; 257/421
(58) Field of Classification Search
USPC .............. 438/3, 239; 257/295, 421, E29.323, 257/E21.665
See application file for complete search history.

(56) References Cited

U.S. PATENT DOCUMENTS

| | | | |
|---|---|---|---|
| 5,640,343 | A | 6/1997 | Gallagher et al. |
| 6,418,048 | B1 * | 7/2002 | Sin et al. ........................ 365/173 |
| 6,545,906 | B1 | 4/2003 | Savtchenko et al. |
| 7,184,300 | B2 | 2/2007 | Savtchenko et al. |
| 7,193,284 | B2 | 3/2007 | Yagami |
| 2002/0105827 | A1 * | 8/2002 | Redon et al. ................... 365/173 |
| 2003/0072174 | A1 | 4/2003 | Savtchenko et al. |
| 2008/0137405 | A1 | 6/2008 | Ohno et al. |
| 2009/0190262 | A1 | 7/2009 | Murakami et al. |
| 2010/0188890 | A1 | 7/2010 | Fukami et al. |

FOREIGN PATENT DOCUMENTS

| | | |
|---|---|---|
| JP | 2005-505889 | 2/2005 |
| JP | 2005-93488 A | 4/2005 |
| JP | 2005-191032 A | 7/2005 |
| JP | 2006-73930 A | 3/2006 |
| JP | 2009-182129 A | 8/2009 |
| WO | WO 2005/069368 A1 | 7/2005 |
| WO | WO 2009/001706 A1 | 12/2008 |

OTHER PUBLICATIONS

K. Yagami et al, "Research Trends in Spin Transfer Magnetization Switching, Journal of the Magnetics Society of Japan vol. 28, p. 937 (2004)".
A. Yamaguchi et al., "Real-Space Observation of Current-Driven Domain Wall Motion in Submicron Magnetic Wires", Physical Review Letters, Vo. 92. p. 077205 (2004).
S. Fukami et al., "Micromagnetic analysis of current driven domain wall motion in nanostrips with perpendicular magnetic anisotropy". Journal of Applied Physics. vol. 103, p. 07E718 (2008).
H. Tanigawa et al, "Current-Driven Domain Wall Motion in CoCrPt Wires with Perpendicular Magnetic Anisotropy" Applied Physics Express, vol. I, p. 011301 (2008).

* cited by examiner

*Primary Examiner* — Theresa T Doan
(74) *Attorney, Agent, or Firm* — McGinn IP Law Group, PLLC

(57) ABSTRACT

A magnetic memory has a magnetic recording layer, a reference layer connected via a non-magnetic layer to the magnetic recording layer, first and second magnetization pinning layers disposed below the magnetic recording layer. The magnetic recording layer and the reference layer have a perpendicular magnetic anisotropy. The magnetic recording layer has a magnetization reversal region having a reversible magnetization and overlapping the difference layer, a first magnetization pinned region connected to a first boundary of the magnetization reversal region with the direction of the magnetization being fixed in a first direction, and a second magnetization pinned region connected to a second boundary of the magnetization reversal region with the direction of magnetization being fixed in a second direction anti-parallel to the first direction. The first and the second magnetization pinning layers fix the magnetization of the first and the second magnetization pinned regions.

7 Claims, 14 Drawing Sheets

MAGNETIC MEMORY AND MANUFACTURING METHOD THEREOF

CROSS-REFERENCE TO RELATED APPLICATIONS

The disclosure of Japanese Patent Application No. 2011-35757 filed on Feb. 22, 2011 including the specification, drawings and abstract is incorporated herein by reference in its entirety.

BACKGROUND

The present invention concerns a magnetic memory and it particularly relates to a magnetic domain wall moving type magnetic random access memory.

In recent years, a magnetic random access memory (MRAM) using a ferromagnetic film having a magnetoresistance effect has been proposed as one of types of non-volatile memories and, particularly development has been conducted vigorously for MRAM using a magnetic tunneling junction film having a giant magnetoresistance effect.

The magnetic tunneling junction (MTJ) is based on a stacked structure in which a non-magnetic insulating film (hereinafter referred to as "tunnel barrier film") is put between a first ferromagnetic film and a second ferromagnetic film. MRAM includes a device using the stacked structure as a memory cell. When current flows in a direction perpendicular to the film surface of the stacked structure, the electric resistance changes depending on the relative angle of the magnetic moment between the first ferromagnetic film and the second ferromagnetic film. The electric resistance is minimized when magnetic moments are in parallel and maximized when they are in anti-parallel to each other. The change of the value of the electric resistance is referred to as a tunneling magneto resistance effect (TMR effect). As the ratio of the TMR effect to the value of the electric resistance (TMR ratio) is greater, it is more advantageous for reading recorded information.

Data is stored in a MRAM by corresponding the case where the direction of the magnetic moments of the two ferromagnetic films are in parallel to binary information "1" and the case where they are in anti-parallel to information "0" respectively. As the TMR ratio is greater, the signal difference between "1" and "0" is larger and reading is easy. Usually, in the two ferromagnetic films, one ferromagnetic film is defined as "pinning layer" (or "reference layer") where the magnetic moment is fixed and the other ferromagnetic film is defined as "free layer" where the direction of the magnetic moment can be changed. Data is stored by putting the magnetic moment of the free layer in parallel or anti-parallel to the magnetic moment of the pinning layer. In the present specification, the free layer as a ferromagnetic film where data is stored is referred to as "magnetic recording layer".

"Asteroid mode (for example, refer to U.S. Pat. No. 5,640,343)" and "toggle mode (for example, refer to U.S. Pat. No. 6,545,096 and Japanese Unexamined Patent Application Publication (Translation of PCT Application) No. 2005-505889 (U.S. Pat. No. 7,184,300) have been known as a method of writing data to MRAM. According to the write systems described above, a reversed magnetic field necessary for reversing the magnetization of a magnetic recording layer increases substantially in inverse proportion to a memory cell size. That is, the write current tends to increase as the memory cell is refined.

As the write method capable of suppressing increase in the write current along with refinement, "a spin transfer method" has been proposed (for example, refer to Japanese Unexamined Patent Application Publication No. 2005-093488 (U.S. Pat. No. 7,193,284) and K. Yagami et al, "Research Trends in Spin Transfer Magnetization Switching, Journal of the Magnetics Society of Japan Vol. 28, p. 937 (2004)". According to the spin transfer method, a spin-polarized current is injected to a ferromagnetic conductor and magnetization is reversed by direct internal action between the spin of conductive electrons carrying on the current and magnetic moment of the conductor (Spin Transfer Magnetization Switching). However, when the spin transfer magnetization switching system is applied to the TMR effect device, a current flows in the direction of the film thickness of the magnetic tunnel junction to possibly destroy the tunnel barrier film by the voltage applied to the magnetic tunnel junction.

As a countermeasure, there has been proposed a method of flowing a current in an in-plane direction of a magnetic recording layer, and reversing the magnetization in the magnetic recording layer to a direction in accordance with the direction of the write current due to the effect of the spin transfer (transfer of spin angular amount of movement) by spin electrons (magnetic domain wall moving type) (for example, refer to Japanese Unexamined Patent Application Publication No. 2005-191032, WO 2005-069368 (US Patent Laid-Open No. 2008137405) and Japanese Unexamined Patent Application Publication No. 2006-73930). The write method according to the system is to be explained briefly with reference to FIG. 1.

FIG. 1 is a cross sectional view showing a configuration of a typical magnetoresistance effect device. The magnetoresistance effect device has a magnetic recording layer 110, a reference layer 112, and a tunnel barrier film 111 put between the magnetic recording layer 110 and the reference layer 112. In FIG. 1, axis x and axis y are defined in parallel to in-plane direction of the magnetic recording layer 110 and the axis z is defined in the direction of the film thickness of the magnetic recording layer. The magnetic recording layer 110 includes a first magnetization pinned region 101, a second magnetization pinned region 103, and a magnetic reversal region 102. The magnetic reversal region 102 has a reversible magnetization and overlaps with the reference layer 112. The first magnetization pinning layer 101 is connected with a first boundary 121 of the reversible region 102 and the direction of the magnetization thereof is fixed in the direction +z. The second magnetization pinned region 103 is connected with a second boundary 122 of the magnetization reversal region 102 and the direction of magnetization thereof is pinned in the direction −z (opposing the magnetization of the first magnetization pinned region 101). Magnetizations in the first and second magnetization pinned regions 101 and 103 in the direction anti-parallel with each other.

On the other hand, magnetization of the magnetization reversal region 102 can be reversed in the direction of the film thickness of the magnetic recording layer 110 and directed to one of the direction +z or the direction −z in a stationary state. In the magnetic recording layer 110, the magnetic domain wall (Domain Wall; DW) is formed to one of the first boundary 121 and the secondary boundary 122. The reference layer 112 is formed so as to oppose the magnetization reversal region 102 of the magnetic recording layer 110 with the tunnel barrier film 111 put between them. The reference layer 112, the tunnel barrier film 111, and the magnetization reversal region 102 provide magnetic tunneling junction (MTJ).

In addition, the magnetoresistance effect device includes a first magnetization pinning layer 119 joined to the first magnetization pinned region 101 and a second magnetization pinning layer 120 joined to the second magnetization pinned region 103. The first magnetization pinning layer 119 includes a magnetically hard ferromagnetic material and has a magnetization in the direction +z. In the same manner, the second magnetization pinning layer 120 includes a magnetically hard ferromagnetic material and has a magnetization in the direction −z. The first magnetization pinning layer 119 has a function of fixing the magnetization of the first magnetization pinned region 101 in the direction +z. The second magnetization pinning layer 120 as a function of fixing the magnetization of the second magnetization pinned region 103 in the direction −z.

Data is written to such a magnetoresistance effect device as described below. It is to be explained assuming that the state where magnetization of the magnetization reversal region 102 is directed to the direction −z and the domain wall is positioned at the first boundary 121 corresponds to data "1" and the state where the magnetization of the magnetization reversal region 102 is directed to the direction +z and the domain wall is situated at the second boundary 122 corresponds to data "0". However, it will be apparent to a person skilled in the art that correspondence between the magnetization direction and the value of data are invertible.

When data "1" is written to the magnetic recording layer 110 where data "0" has been written, a write current is supplied from the first magnetization pinned region 101 through the magnetization reversal region 102 to the second magnetization pinning layer 103. That is, a spin-polarized current is transferred from the second magnetization pinned region 103 to the magnetization reversal region 102. Thus, the domain wall moves from the second boundary 122 to the first boundary 121 and magnetization of the magnetization reversal region 102 is directed to the direction −z, that is, data "1" is written. On the other hand, when data "0" is written into the magnetic recording layer 100 where the data "1" has been written, a write current is supplied from the second magnetization pinned region 103 through the magnetization reversal region 102 to the first magnetization pinned region 101. That is, the spin polarized electrons are transferred from the first magnetization pinned region 101 to the magnetization reversal region 102. Thus, the magnetic domain wall moves from the first boundary 121 to the second boundary 122 and the magnetization of the magnetization reversal region 102 is directed to the direction +z, that is, data "0" is written. As described above, data is written when the magnetic domain wall (DW) in the magnetic recording layer 110 moves between the first boundary 121 and the second boundary 122 of the magnetization reversal region 102 by the current flowing between the first magnetization pinned region 101 and the second magnetization pinned region 103.

According to this mode, since current flowing upon writing does not pass through the tunneling barrier film 111, deterioration of the tunneling barrier film 111 is suppressed. Further, since data is written by the spin transfer mode, the write current is decreased along with reduction of the memory size. Further, since the moving distance of the magnetic domain wall (DW) is decreased as the memory size is reduced, the write speed increases along with refinement of the memory cell.

FIG. 1 shows a case where the magnetic recording layer 110 has a perpendicular magnetic anisotropy and magnetization of the magnetic recording layer 110 is directed to the direction of the film thickness. However, the magnetization of the magnetic recording layer may also be directed to the in-plane direction. The configuration where the magnetization of the magnetic recording layer is directed to the in-plane direction is disclosed, for example, in A. Yamaguchi et al., "Real-Space Observation of Current-Driven Domain Wall Motion in Submicron Magnetic Wires", Physical Review Letters, Vo. 92. p. 077205 (2004). However, for decreasing the write current, a configuration where the magnetization of the magnetic recording layer is directed to the direction of the film thickness is more preferred than the configuration where the magnetization of the magnetic recording layer is directed to the in-plane direction. In the technique disclosed by A. Yamaguchi et al. described above, a current density necessary for moving a current-induced magnetic domain wall is about $1 \times 10^8$ [A/cm$^2$]. In this case, the write current is 1 mA for the magnetic recording layer 110, for example, of 100 nm width and 10 nm film thickness. On the other hand, as described in S. Fukami et al., "Micromagnetic analysis of current driven domain wall motion in nanostrips with perpendicular magnetic anisotropy", Journal of Applied Physics, vol. 103, p. 07E718 (2008), it is reported that the write current can be decreased sufficiently by using a material having a perpendicular magnetic anisotropy as the magnetic recording layer. In view of the above, in a case of manufacturing a MRAM by utilizing the current-induced magnetic domain wall motion, it can be said that a ferromagnetic material having perpendicular magnetic anisotropy is used preferably for the layer of causing magnetic domain wall motion. H. Tanigawa et al, reported in "Current-Driven Domain Wall Motion in CoCrPt Wires with Perpendicular Magnetic Anisotropy" Applied Physics Express, vol. 1, p. 011301 (2008) that a current-induced magnetic domain wall motion was observed in a material having perpendicular magnetic anisotropy. As described above, it is expected that a MRAM decreased in the write current is provided by utilizing the phenomenon of the current induced magnetic domain wall motion in the material having perpendicular magnetic anisotropy.

As a relevant technique, WO 2009/001706 (US Patent Laid-Open No. 2010188890) discloses a magnetoresistance effect device and a magnetic random access memory. The magnetoresistance effect device includes a magnetization free layer, a spacer layer disposed adjacent with the magnetization free layer, a first magnetization pinning layer disposed adjacent with the spacer layer on the side opposite to the magnetization free layer, and at least two magnetization pinning layers disposed adjacent with the magnetization free layer. The magnetization free layer, the first magnetization pinning layer, and the second magnetization pinning layer have a magnetization component substantially perpendicular to the film surface. The magnetization free layer has two magnetization pinned portions and a magnetic domain wall moving portion disposed between the two magnetization pinned portions. Magnetizations of the two magnetization pinned portions forming the magnetization free layer are fixed substantially in anti-parallel to each other in the direction substantially perpendicular to the film surface. The magnetic domain wall moving portion is provided with magnetic anisotropy in the direction perpendicular to film surface.

Further, Japanese Patent Application Publication No. 2009-182129 (US Patent Laid-Open No. 2009190262) discloses a magnetoresistance effect device and a manufacturing method thereof. The magnetoresistance effect device has a magnetoresistance effect film and a pair of electrodes for flowing a current perpendicular to the film surface of the magnetoresistance effect film. The magnetoresistance film includes a magnetization pinning layer, a magnetization free layer, an intermediate layer, a cap layer, and a functional layer. In the magnetization pinning layer, the magnetization direction is fixed substantially in one direction. The magnetization direction of the magnetization free layer changes in accordance with an external magnetic field. The intermediate layer is disposed between the magnetization pinning layer and the magnetization free layer. The cap layer is disposed above the magnetization pinning layer or the magnetization free layer. The functional layer is disposed in the magnetization pinning layer, in the magnetization free layer, at the boundary between the magnetization pinning layer and the intermediate layer, at the boundary between the intermediate layer and the magnetization free layer, or the boundary between the magnetization pinning layer or the magnetization free layer and the cap layer and is formed of a material containing oxygen or nitrogen. The crystal orientation face of the functional layer is different from the crystal orientation face of the adjacent layer above or below thereof.

SUMMARY

One of the problems in manufacturing a MRAM by utilizing magnetic domain wall motion in write operation is how to introduce the magnetic domain wall stably in a layer where magnetic domain wall motion occurs. In Japanese Unexamined Patent Application Publication No. 2005-191032, a magnetic domain wall can be formed at the first boundary 121 or the second boundary 122 since the directions of magnetization of the first magnetization pinned region 101 and the second magnetization pinned region 103 are opposed to each other.

However, it is actually not easy to fix the direction of magnetization opposed each other to respective directions while introducing a magnetic domain wall to a desired position. Japanese Patent Application Publication No. 2005-191032 and WO 2009/001706 disclose a method of using materials of different coercive forces (Hc) respectively for directing magnetizations of the first magnetization pinning layer in contact with the first magnetization pinned region and the second magnetization pinning layer in contact with the second magnetization pinned region to directions opposite to each other. In this case, since the first magnetization pinning layer and the second magnetization pinning layer have to be formed separately, there may be a possibility of lowering the yield due to manufacturing error or variation.

As another method, a method of providing a difference to the coercive force (Hc) by changing the size between the first magnetization pinning layer and the second magnetization pinning layer is disclosed. In this case, when positional displacement should occur in the magnetization pinning layer and the magnetic recording layer, leak magnetic field from the magnetization pinning layer varies and it is difficult to stably introduce the magnetic domain wall. Further, the larger magnetization pinning layer tends to undergo the effect of other processes and there may be a possibility that no desired coercive force can be obtained.

H. Tanigawa et al, in the Applied Physics Express described above adopt a method of not using the magnetization pinning layer, by forming a magnetic thin lines and then removing a portion thereof by etching to form magnetic thin wires having a stepped structure. In such a stepped structure, since the coercive force in a thin film region is smaller compared with the coercive force of a thick film region, a magnetic domain wall can be introduced by using a magnetic field of such an appropriate magnitude as reversing the thin film region but not reversing the thick film region. As the external magnetic field in this case, a magnetic field in a direction perpendicular to the surface of the substrate is used. However, in a case of disposing such a stepped structure, since the magnetic layer of the magnetic domain wall moving region is directly etched, it is inevitable to undergo the etching damage. The magnetic characteristic inherent to the magnetic layer may be deteriorated to possibly hinder the magnetic domain wall motion.

The present invention intends, in a magnetic domain wall moving type MRAM using a material having perpendicular magnetic anisotropy, to provide a structure capable of stably and easily introducing a magnetic domain wall, and a manufacturing method thereof.

Means for solving the problem are to be described below with reference to numerals and references used for preferred embodiments of the invention. The numerals and references are parenthesized for indicating the correspondence between the description of the claims and the preferred embodiments of the invention. However, such numerals and references should not be used for the interpretation of the technical range of the inventions described in the claims.

According to one aspect of the present invention, a magnetic domain wall moving type MRAM includes a ferromagnetic recording layer (10) which is a ferromagnetic layer, a reference layer (12) connected to the magnetic recording layer (10) by way of a non-magnetic layer (11), and a first magnetization pinning layer (19) and a second magnetization pinning layer (20) disposed below the magnetic recording layer (10) along the line normal to the film. The magnetic recording layer (10) and the reference layer (12) have a perpendicular magnetic anisotropy. The magnetic recording layer (10) has a magnetization reversal region (2) having a reversible magnetization and overlapping the reference layer (12), a first magnetization pinned region (1) connected to the first boundary (21) of the magnetization reversal region (2) with the direction of magnetization being fixed in the first direction, and a second magnetization pinned region (3) connected to the second boundary (22) of the magnetization reversal region (2) with the direction of magnetization being fixed in the second direction anti parallel to the first direction. The first magnetization pinning layer (19) and the second magnetization pinning layer (20) fix the magnetization in the respective first magnetization pinned region (1) and the second magnetization pinned region (3). The second magnetization pinning layer (20) is modified such that the coercive force (Hc) thereof is smaller compared with that of the first magnetization pinning layer (19).

According to another aspect of the present invention, a method of manufacturing the magnetic domain wall moving type MRAM includes the steps described below. The MRAM includes a magnetic recording layer (10) as a ferromagnetic layer, a reference layer (12) connected to the magnetic recording layer (10) by way of a non-magnetic layer (11), and a first magnetization pinning layer (19) and a second magnetization pinning layer (20) disposed below the magnetic recording layer (10) along the line normal to the film. The magnetic recording layer (10) and the reference layer (12) have a perpendicular magnetic anisotropy. The magnetic recording layer (10) has a magnetization reversal region (2) having a reversible magnetization and overlapping with the reference layer (12), a first magnetization pinned region (1) connected to the first boundary (21) of the magnetization reversal region (2) with the direction of the magnetization being fixed in the first direction, and a second magnetization pinned region (3) connected to the second boundary (22) of the magnetization reversal region (2) with the direction of magnetization being fixed in the second direction in anti-parallel to the first direction. The first magnetization pinning layer (19) and the second magnetization pinning layer (20) fix the magnetization of the first magnetization pinned region (1) and the second magnetization pinned region (3) respectively. The second magnetization pinning layer (20) is modified such that the coercive force (Hc) is smaller than that of the first magnetization pinning layer (19). The method of manufacturing the magnetic domain wall moving type MRAM includes a step of forming a magnetization pinning layer film (18); a step of forming a hard mask (17) over the magnetization pinning layer film (18); a step of forming a protective film (61) so as to cover the hard mask (17) stacked over a region of the hard mask (17) other than the region of forming the second magnetization pinning layer (20) in the magnetization pinning layer film (18); a step of processing the hard mask (17) using the protective film (61) as a mask; a step of patterning the hard mask (17) after removing the protective film (61); and a step of patterning the magnetization pinning layer film (18) using the patterned hard mask (17) as a mask thereby forming the first magnetization pinning layer (19) and the second magnetization pinning layer (20).

The semiconductor device of the invention has word lines (WL), bit lines (BL), transistors (TR), and magnetic memories (72+73). In the transistor (TR), the word line (WL) is connected to a gate (44) and the bit line (BL) is connected to one of the source/drain (46). The magnetic memory (72+73) is connected to the other of the source/drain (47). The magnetic memory (72+73) has a magnetic recording layer (10), the reference layer (12), and the first magnetization pinning layer (19), and the second magnetization pinning layer (20). The magnetic recording layer (10) is a ferromagnetic layer. The reference layer (12) is connected by way of the nonmagnetic layer (11) to the magnetic recording layer (10). The first magnetization pinning layer (19) and the second magnetization pinning layer (20) are disposed below the magnetic recording layer (10) along the line normal to the film. The magnetic recording layer (10) and the reference layer (12) have a perpendicular magnetic anisotropy. The magnetic recording layer (10) includes the magnetization reversal region (2), the first magnetization pinned region (1), and the second magnetization pinned region (3). The magnetization reversal region (2) has a reversible magnetization and overlaps the reference layer (12). The first magnetization pinning layer (1) is connected to the first boundary of the magnetization reversal region (2) with the direction of the magnetization being fixed in a first direction. The second magnetization pinned region (3) is connected to the second boundary of the magnetization reversal region (2) with the direction of magnetization being pinned in the second direction anti-parallel to the first direction. The first magnetization pinning layer (19) and the second magnetization pinning layer (20) fix the magnetization of the first magnetization pinned region (1) and the second magnetization pinned region (2), respectively. The second magnetization pinning layer (20) has a coercive force lower than that of the first magnetization pinning layer (19). The first magnetization pinning layer (19) and the second magnetization pinning layer (20) are formed of an identical material and in an identical shape.

According to the aspects of the present invention, magnetic domain wall can be introduced stably and easily to the magnetic recording layer in the magnetic domain moving type MRAM using the material having the vertical magnetic anisotropy. Accordingly, the manufacturing cost can be saved and the reliability is improved.

DETAILED DESCRIPTION

Figure 1:
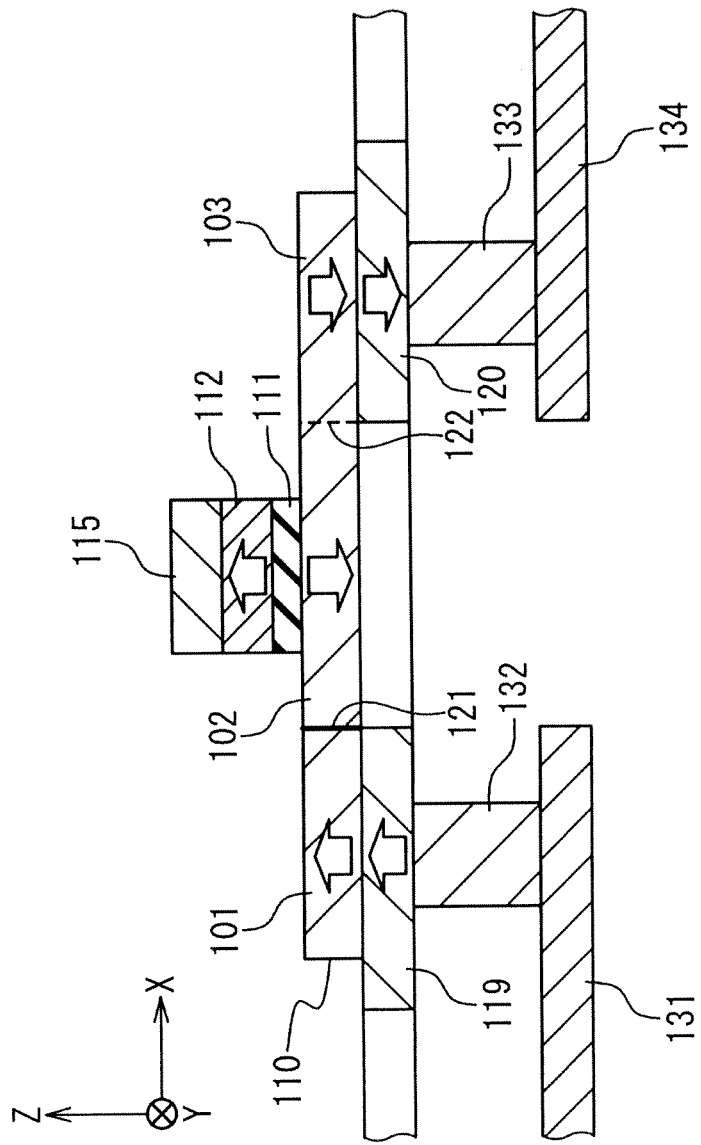
FIG. 1 is a cross sectional view showing the configuration of a typical magnetoresistance effect device.

A magnetic domain wall moving type magnetic random access memory (MRAM) and a manufacturing method thereof of the present invention are to be described with reference to the accompanying drawings in the drawings. It should be noted that identical or similar constituent elements are sometimes referred to by identical or corresponding references.

First Embodiment

Figure 2:
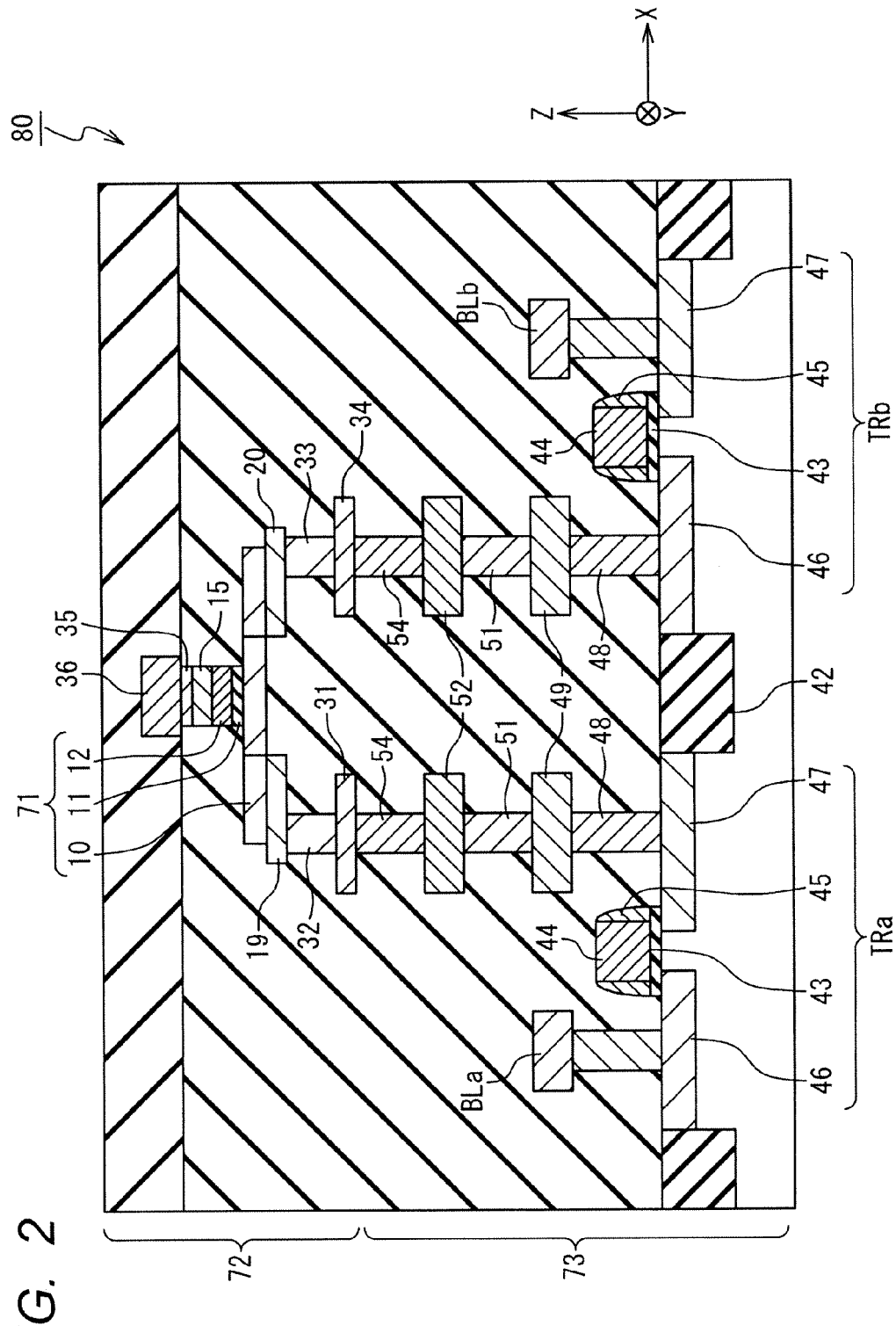
FIG. 2 is a cross sectional view showing the configuration of a main portion of a magnetic domain wall moving type MRAM according to a first embodiment of the invention.

A magnetic domain wall moving type MRAM according to a first embodiment of the invention is to be described. FIG. 2 is a cross sectional view showing a configuration for a main portion of the magnetic domain wall moving type MRAM according to the first embodiment of the invention. The magnetic domain wall moving type MRAM includes a plurality of memory cells arranged in a matrix. The drawing corresponds to a memory cell for 1 bit portion of the magnetic domain wall moving type MRAM. The memory cell of the magnetic domain wall moving type MRAM has a memory device portion 72 and an address selection transistor portion 73. In the following description, a xyz orthogonal coordinate is defined for MRAM and description is to be made by using the xyz orthogonal coordinate.

At first, the selection transistor portion 73 is to be described. In a semiconductor substrate (for example, p type silicon substrate, p-type well region, etc.) 41, a device isolation insulating layer 42 having a STI (shallow trench isolation) structure is formed. A read selection switch is formed in a region surrounded by a device isolation insulating layer 42. The read selection switch includes MOS transistors (N channel type MOS transistor) TRa and TRb. A gate insulating film 43, a gate electrode 44, and a side wall insulating layer 45 are formed for MOS transistors TRa and TRb over the semiconductor substrate 41. The gate electrode 44 is connected to a word line WL (not illustrated). The MOS transistor functions to select read cell upon read operation. Diffusion layer regions 46, 47 are formed on both sides of the gate electrode 44. An insulating layer is stacked over the MOS transistors TRa and TRb. As a contact layer 48 for connection to the diffusion layers 46, 47, a tungsten plug is formed for example in the insulating layer. First metal layers are formed by way of the contact layer 48. One of the first metal layers functions as an intermediate layer 49 for vertically stacking a plurality of contact layers. The other of them functions as bit lines BLa and BLb. An insulating layer is further stacked over the first metal layer. In the insulating layer, second metal layers are formed by way of a contact layer 51 connected to the intermediate layer 49. Also the second metal layer functions as an intermediate layer 52 for vertically stacking a plurality of contact layers. An insulating layer is further stacked over the second metal layer. Third metal layers are formed by way of a contact layer 54 to be connected to the intermediate layer 52 in the insulating layer. The third metal layer functions as a writing word line. One of the writing word lines is connected as a first wiring 31 by way of a first contact via 32 to a magnetoresistance effect device 71 and the other of them is connected as a second wiring 34 by way of a second contact via 33 to the magnetoresistance effect device 71.

Figure 3A:
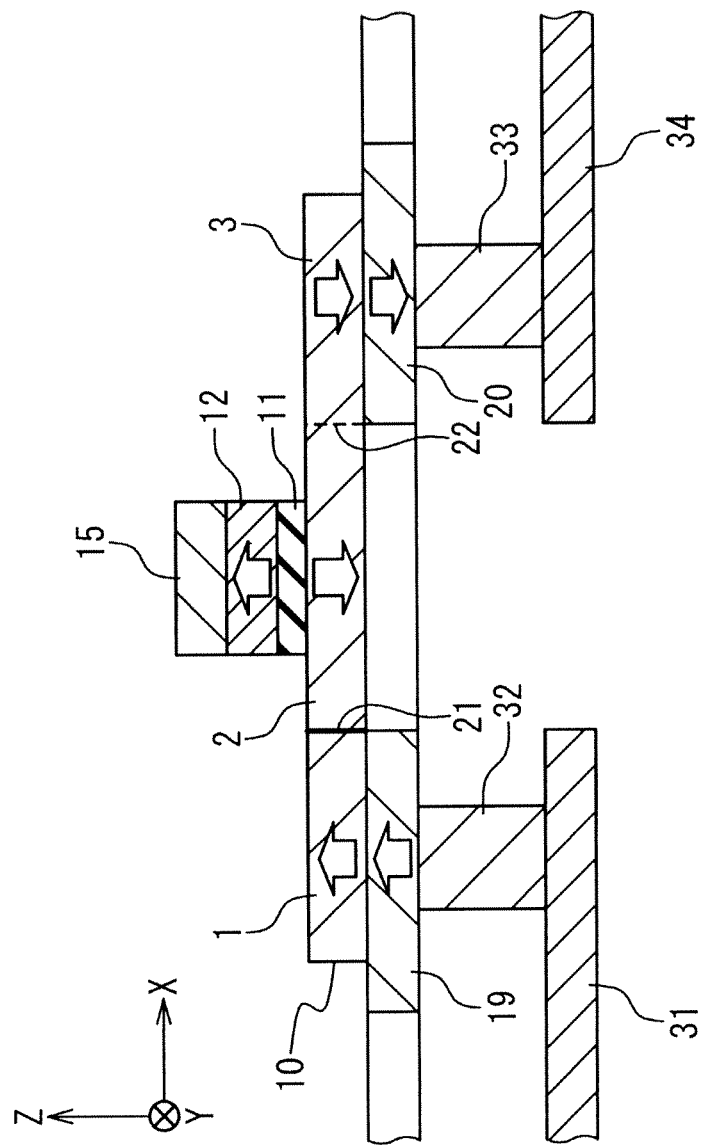
FIG. 3A is a cross sectional view showing a constitution of a memory device portion of a magnetic domain wall moving type MRAM according to the first embodiment of the invention.

Then, the memory device portion 72 is to be described. FIG. 3A is a cross sectional view showing the configuration of a memory device portion of a magnetic domain wall moving type MRAM according to the first embodiment of the invention. The memory device portion 72 has a magnetoresistance effect device 71. The magnetoresistance effect 71 has a magnetic recording layer 10 and a reference layer 12 as ferromagnetic layers, and a tunnel barrier layer 11 as a non-magnetic layer. The tunnel barrier layer 11 is put between the magnetic recording 10 and the reference layer 12. The magnetic recording layer 10, the tunnel barrier layer 11, and the reference layer 12 fault a magnetic tunnel junction (MTJ). The reference layer 12 is connected by way of an anti ferromagnetic layer 15 (to be described layer) and a third contact via 35 to a read wiring 36 (for example, grounding line) (refer to FIG. 2).

The runnel barrier layer 11 is a thin insulating film and formed, for example, of an aluminum oxide film (Al-Ox) formed by oxidizing, for example, an Al film or magnesium oxide (MgO). The reference layer 12 and the magnetic recording layer 10 are ferromagnetic films having a perpendicular magnetic anisotropy, and the direction of magnetization of the magnetic recording layer 10 and the reference layer 12 is directed to the direction of the film thickness. The magnetic recording layer 10 and the reference layer 12 comprise iron (Fe), cobalt (Co), nickel (Ni), or an alloy containing one of them. When the magnetic recording layer 10 and the reference layer 12 contain Pt and Pd, the perpendicular magnetic anisotropy can be stabilized. In addition, they can be adjusted such that a desired magnetic characteristic can be provided by adding, for example, B, C, N, O, Al, Si, P, Ti, V, Cr, Mn, Cu, Zn, Zr, Nb, Mo, Tc, Ru, Rh, Ag, Hf, Ta, W, Re, Os, Ir, Au, and Sm. Specifically, the material that can be used as the magnetic recording layer 10 and the reference layer 12 includes, for example, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, and Sm—Co. In addition, the magnetic anisotropy in the perpendicular direction can also be provided by stacking a layer containing one of materials selected from Fe, Co, and Ni to a different layer. Specifically, they include stacked films, for example, of Co/Pd, Co/Pt, and Fe/Au.

Further, in the reference layer 12, an anti-ferromagnetic layer 15 is stacked so as to increase the coercive force of the ferromagnetic film. That is, the ferromagnetic film can be provided with the anisotropy in one direction by exchanging interaction exerting between the ferromagnetic film and the anti-ferromagnetic layer 15 by stacking the reference layer 12 to the anti-ferromagnetic layer 15. Thus, magnetization of the reference layer 12 can be fixed in one direction. As the anti-ferromagnetic layer 15, manganese alloy anti-ferromagnetic films such as of iron-manganese (FeMn), platinum-manganese (PtMn), nickel-manganese (NiMn), etc., or oxide anti-ferromagnetic film such as of cobalt oxide (CuO) and nickel oxide (NiO) are used.

As shown in FIG. 3A, the magnetic recording layer 10 according to this embodiment has three different regions, that is, a first magnetization pinned region 1, a second magnetization pinned region 3, and a magnetization reversal region 2. The first magnetization pinned region 1 and the second magnetization pinned region 3 have magnetization arranged in anti-parallel where they oppose each other in the direction. On the other hand, the magnetization reversal region 2 has magnetization capable of reversing magnetization between the direction +z and the direction −z. That is, the magnetization of the magnetization reversal region 2 is allowed to be in parallel or anti-parallel with the magnetization of the reference layer 12. The magnetization reversal region 2 is formed to a portion between the first magnetization pinned region 1 and the second magnetization pinned region 3. The reference layer 12 is formed so as to overlap the magnetization reversal region 2. In other words, a portion of the magnetization reversal region 2 of the magnetic recording layer 10 opposes the reference layer 12 by way of the tunnel barrier layer 11, and the reference layer 12, the tunnel barrier layer 11, and the magnetization reversal region 2 form a magnetic tunnel junction (MTJ).

In this embodiment, it is assumed that the magnetization of the reference layer 12 is fixed to the direction +z. Further, magnetization of the first magnetization pinned region 1 is fixed in the direction +z and the magnetization of the second magnetization pinned region 3 is fixed in the direction −z respectively. As shown in FIG. 3A, a first magnetization pinning layer 19 is disposed below the film surface of the first magnetization pinned region 1 so as to be in contact with the first magnetization pinned region 1. One end of the first magnetization pinning layer 19 is formed at a position substantially identical with a first boundary 21 as a boundary between the first magnetization pinned region 1 and the magnetization reversal region 2. In other words, the end where the first magnetization pinning layer 19 and that of the magnetic recording layer 10 are in contact form the first boundary 21.

On the other hand, a second magnetization pinning layer 20 is disposed also below the film surface of the second magnetization pinned region 3 so as to be in contact with the second magnetization pinned region 3. One end of the second magnetization pinning layer 20 is formed at a position substantially identical with a second boundary 22 that is the boundary between the second magnetization pinned region 3 and the magnetization reversal region 2. In other words, the end where the second magnetization pinning layer 20 and that of the magnetic recording layer 10 are in contact form the second boundary 22.

The first magnetization pinning layer 19 and the second magnetization pinning layer 20 are formed of an identical ferromagnetic material. That is, the first magnetization pinning layer 19 and the second magnetization pinning layer 20 are formed, for example, of iron (Fe), cobalt (Co), nickel (Ni), or an alloy containing one of them. When Pt or Pd is incorporated, the perpendicular magnetic anisotropy can be stabilized. In addition, they can be adjusted so as to develop a desired magnetic characteristic by the addition, for example, of B, C, N, O, Al, Si, P, Ti, V, Cr, Mn, Cu, Zn, Zr, Nb, Mo, Tc, Ru, Rh, Ag, Hf, Ta, W, Re, Os, Ir, Au, and Sm. Specifically, materials that can be used as the first magnetization pinning layer 19 and the second magnetization pinning layer 20 include, for example, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, and Sm—Co. In addition, the magnetic anisotropy in the perpendicular direction can be developed also by stacking a layer containing one of materials selected from Fe, Co, and Ni with a different layer. Specifically, they include, for example, stacked films of Co/Pd, Co—Pt, and Fe/Au.

Figure 3B:
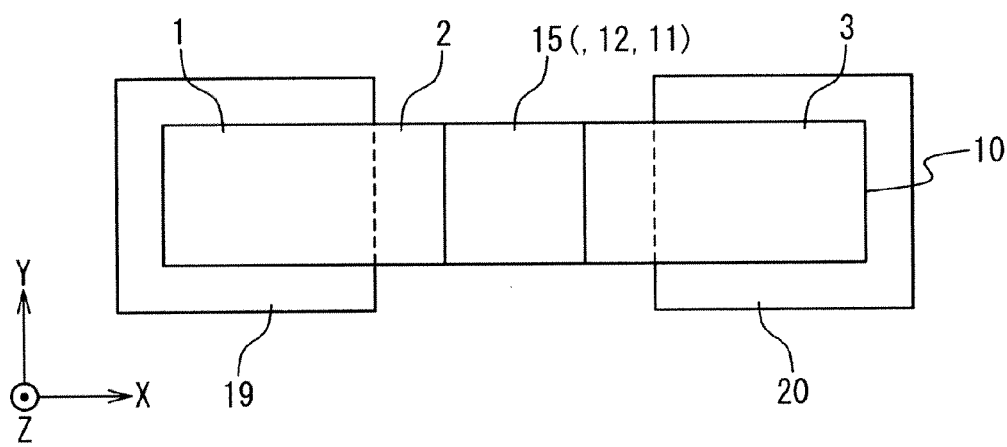
FIG. 3B is a plan view showing a constitution of a memory device portion of a magnetic domain wall moving type MRAM according to the first embodiment of the invention.
Figure 3C:
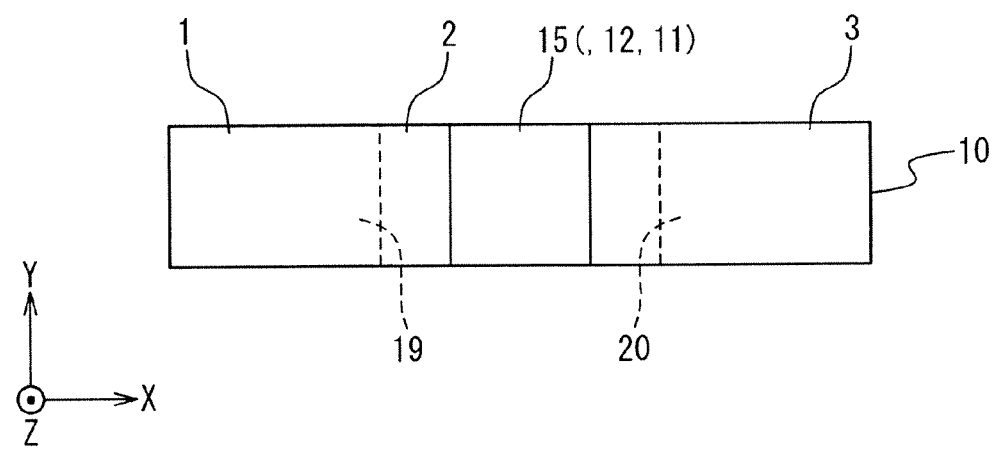
FIG. 3C is a plan view showing a modified example of a configuration for a memory device portion of a magnetic domain moving MRAM according to the first embodiment of the invention.

FIG. 3B is a plan view for the configuration of FIG. 3A. As shown in FIG. 3A and FIG. 3B, the first magnetization pinning layer 19 and the second magnetization pinning layer 20 are in a substantially identical shape. Specifically, they are formed to such an identical size that the coercive force (Hc) of the first magnetization pinning layer 19 and the coercive force (Hc) of the second magnetization pinning layer 20 do not change by the shape anisotropy thereof. Accordingly, they may include a range of manufacturing error (manufacturing variation). In the same manner, as shown in FIG. 3A and FIG. 3B, the first magnetization pinned region 1 and the second magnetization pinned region 2 are in a substantially identical shape. As shown in FIG. 3C (plan view of a modified example of the configuration of FIG. 3A and FIG. 3B), they may be such a configuration that the first magnetization pinning layer 19 and the second magnetization pinning layer 20 are in a substantially identical shape, the first magnetization pinned region 1 and the second magnetization pinned region 2 are in a substantially identical shape and, further, the end of the first magnetization pinned region 1 and that of the first magnetization pinning layer 19 are aligned, and the end of the second magnetization pinned region 3 and that of the second magnetization pinned region 20 are aligned. In the case described above, only the end faces in the direction X may be aligned, only the end faces in the direction Y may be aligned, or both of the end faces in the direction X and the direction Y may be aligned.

While the first magnetization pinning layer 19 and the second magnetization pinning layer 20 are formed of an identical ferromagnetic material and substantially in an identical shape, the coercive force (reversal magnetic field) He are different from each other. One of the first magnetization pinning layer 19 and the second magnetization pinning layer 20 undergoes the change of the magnetic characteristic during manufacturing step compared with the other of them. As to be described later, denaturation factors includes, for example, damages due to etching or ion implantation to the hard mask 17 or the cap layer 16 (stress strain) during manufacture.

For supplying a write current, first wirings 31, a first via contact 32, a second via contact 33, and second wirings 34 are disposed to the memory device portion 72. The first wirings 31 are connected by way of the first via contact 32 to the first magnetization pinning layer 19. The second wirings 34 are connected by way of the second via contact 33 to the second magnetization pinning layer 20. The first wirings 31 and the second wirings 34 are formed of a material of low electric resistance such as aluminum (Al), copper (Cu), or tungsten (W).

A method of manufacturing a magnetic domain wall moving type MRAM according to the first embodiment of the invention is to be described. FIG. 4A to FIG. 4I are cross sectional views showing the flow for the method of manufacturing the magnetic domain wall moving type MRAM according to the first embodiment of the invention.

At first, after forming the first wirings 31 and the second wirings 34, an insulating layer is formed so as to cover the first wirings 31 and the second wirings 34. Further, after opening a hole by reactive etching (RIE), etc. in the insulating layer, a conductive material such as copper (Cu) or tungsten (W) is buried therein to form the first contact via 32 and the second contact via 33. Since the steps so far can be performed by the same method as in the case of FIG. 1, they are not illustrated.

Figure 4A:
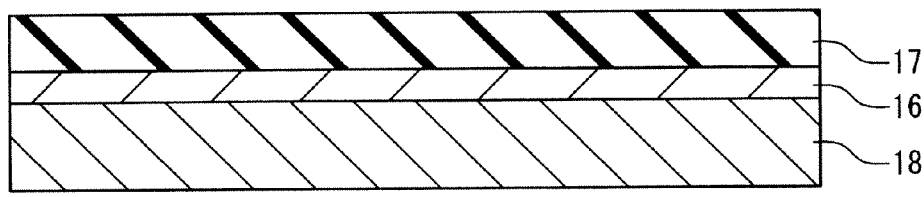
FIG. 4A is a cross sectional view showing a flow of a method of manufacturing a magnetic domain wall moving type MRAM according to the first embodiment of the invention.

Then, as shown in FIG. 4A, a ferromagnetic film 18 for forming magnetization pinning layers (19, 20) is deposited by a method, for example, of sputtering. Then, a cap layer 16 and a hard mask 17 for patterning the magnetization pinning layers (19, 20) are stacked. The cap layer 16 is a Ta film, for example, of 5 to 10 nm thickness. The hard mask 17 is a silicon oxide ($SiO_2$) film, a silicon nitride (SiN) film, or a stacked film formed by depositing silicon oxide ($SiO_2$) over the silicon nitride (SiN) film at a thickness of 50 to 100 nm. In this case, a stacked film formed by depositing silicon oxide ($SiO_2$) over silicon nitride (SiN) is used as an example.

Figure 4B:
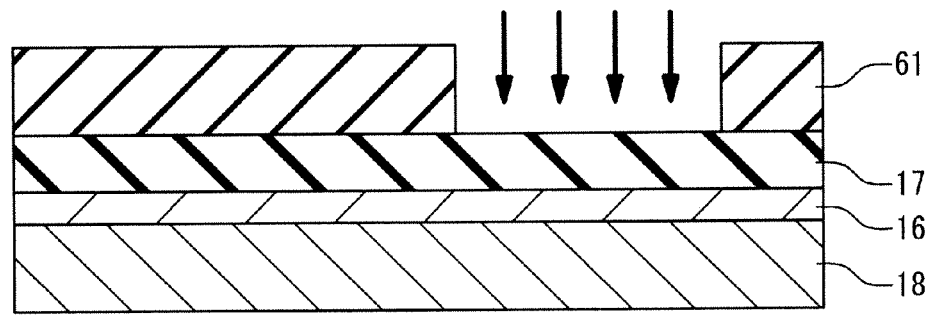
FIG. 4B is a cross sectional view showing a flow of a method of manufacturing a magnetic domain wall moving type MRAM according to the first embodiment of the invention.
Figure 4C:
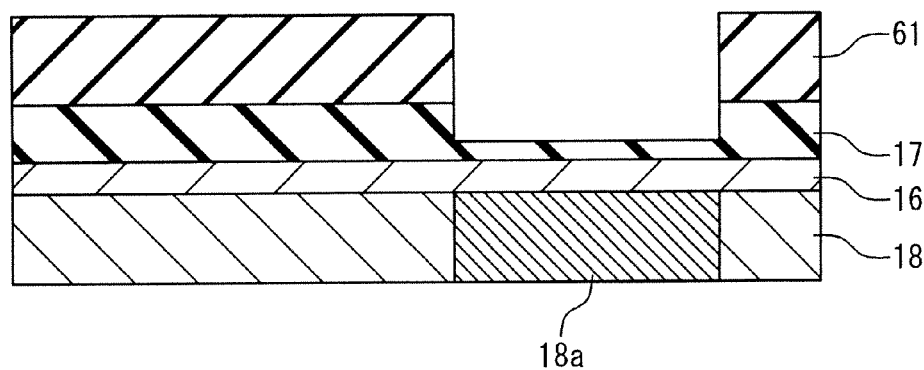
FIG. 4C is a cross sectional view showing a flow of a method of manufacturing a magnetic domain wall moving type MRAM according to the first embodiment of the invention.

Successively, as shown in FIG. 4B, a resist mask 61 for etching the hard mask 17 is formed. A pattern in which only the region forming one of the magnetization pinning layers is formed in the resist mask 61. In the pattern of FIG. 4B, the region forming the first magnetization pinning layer 19 is patterned. It may also be patterned such that a region forming the opposite second magnetization pinning layer 20 is masked. Using the resist mask 61, the hard mask 17 is etched physically and chemically. That is, the hard mask 17 is etched by the method such as reactive ion etching by way of the resist mask 61 in this embodiment. As a result, in the hard mask 17, the silicon oxide ($SiO_2$) film is etched to leave the silicon nitride (SiN) film as shown in FIG. 4C. By the etching of the hard mask 17, the coercive force (Hc) of the ferromagnetic film 18a below the etched hard mask 17 is lowered.

As the conditions for the reactive ion etching, etching conditions for the hard mask using $CF_4$ or $CHF_3$ as the reaction gas known so far can be utilized as they are. Based thereon, the etching conditions are changed or selected appropriately in accordance with the amount of change intended to be provided to the coercive force Hc of the ferromagnetic film 18 as will be described later. Etching may be performed as far as the silicon nitride (SiN) film or etching may be performed so as to leave a portion of the silicon oxide ($SiO_2$) film. Further, also in a case of forming the hard mask 17 only comprising the silicon nitride (SiN) film or the silicon oxide ($SiO_2$) film, etching may be performed so as to leave a portion of the silicon nitride (SiN) film or the silicon oxide ($SiO_2$) film, or etching may be performed for the entire portion.

Figure 4D:
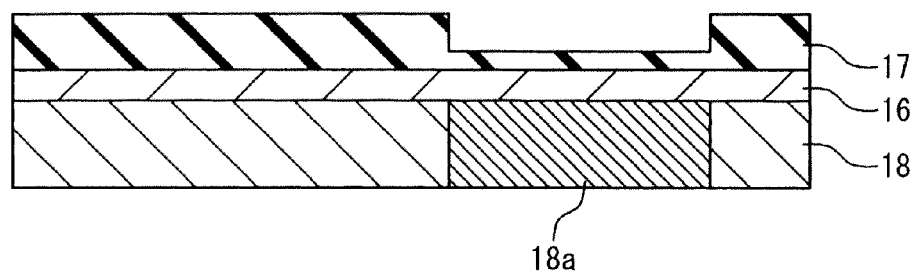
FIG. 4D is a cross sectional view showing a flow of a method of manufacturing a magnetic domain wall moving type MRAM according to the first embodiment of the invention.
Figure 4E:
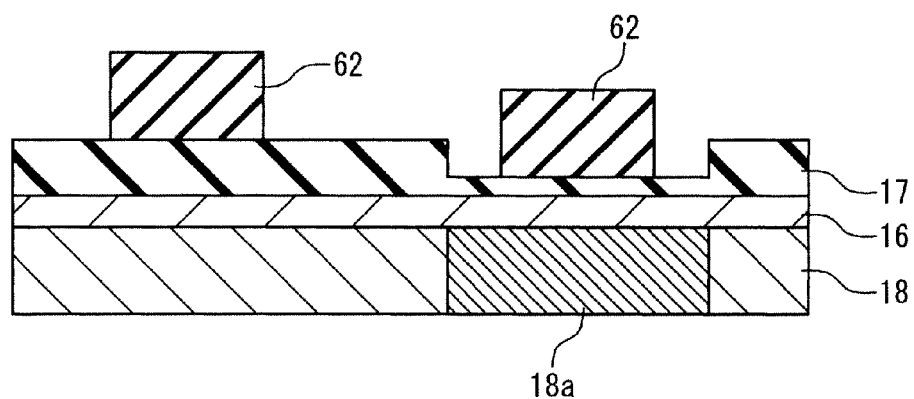
FIG. 4E is a cross sectional view showing a flow of a method of manufacturing a magnetic domain wall moving type MRAM according to the first embodiment of the invention.

Then, as shown in FIG. 4D, the resist mask 61 is peeled. Then, as shown in FIG. 4E, a resist mask 62 is formed for etching the remaining hard mask 17 as shown in FIG. 4E. A pattern is formed to the resist mask 62 for patterning the magnetization pinning layers 19, 20. That is, the resist mask 62 has a mask pattern that both of magnetization pinning layers 19, 20 can be formed. The pattern is formed such that the magnetization pinning layers 19, 20 are in an identical shape.

Figure 4F:
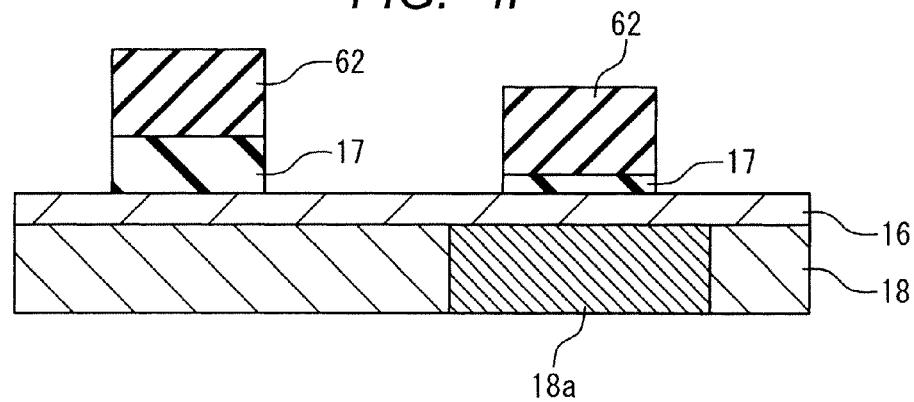
FIG. 4F is a cross sectional view showing a flow of a method of manufacturing a magnetic domain wall moving type MRAM according to the first embodiment of the invention.

Successively, as shown in FIG. 4F, the hard mask 17 is etched by a method, for example, of reactive ion etching by using the resist mask 62. In this case, the thickness of the hard mask 17 stacked over the ferromagnetic film 18 is different between a region where the first magnetization pinning layer 19 is formed and a region where the second magnetization pinning layer 20 is formed. Therefore, there may a possibility that a portion of the ferromagnetic film 18 where the hard mask 17 is thin may be possibly etched. However, since the cap layer 16 comprising a material of high selectivity to the material for the hard mask 17 is formed over the ferromagnetic film 18, the ferromagnetic film 18 for the magnetization pinning layer can be prevented from being etched. Even when the cap layer 16 is not present, by etching the hard mask 17 under the condition for selectively etching the silicon nitride (SiN) film or the silicon oxide ($SiO_2$) film, the ferromagnetic film 18 therebelow can be prevented from being etched.

Figure 4G:
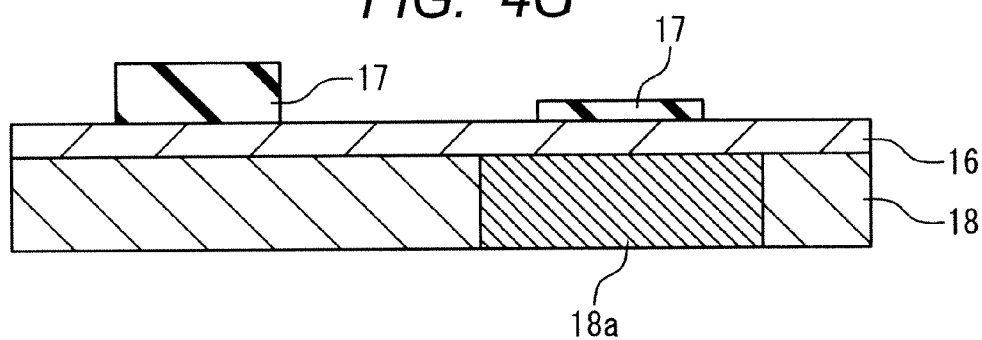
FIG. 4G is a cross sectional view showing a flow of a method of manufacturing a magnetic domain wall moving type MRAM according to the first embodiment of the invention.
Figure 4H:
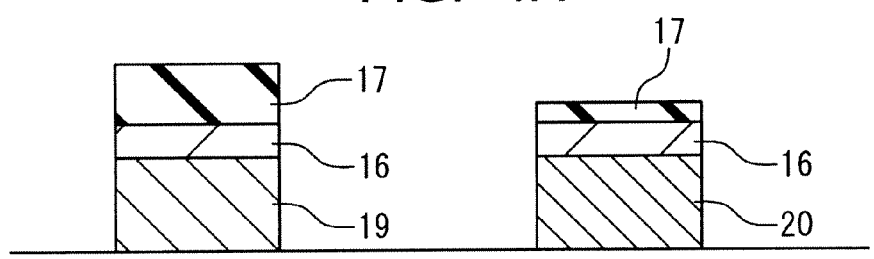
FIG. 4H is a cross sectional view showing a flow of a method of manufacturing a magnetic domain wall moving type MRAM according to the first embodiment of the invention.
Figure 4I:
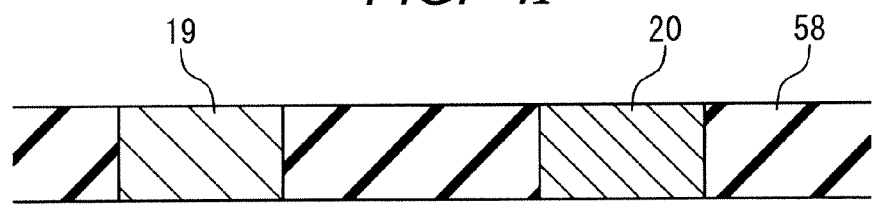
FIG. 4I is a cross sectional view showing a flow of a method of manufacturing a magnetic domain wall moving type MRAM according to the first embodiment of the invention.

Then, as shown in FIG. 4G, the resist mask 62 is peeled. Then, as shown in FIG. 4H, the ferromagnetic film 18 is etched together with the cap layer 16, for example, by ion milling or reactive ion etching using the hard mask 17 as a mask. Thus, the first magnetization pinning layer 19 and the second magnetization pinning layer 20 are formed into desired shapes. Then, after depositing an insulating layer 58 such as of silicon oxide ($SiO_2$), the insulating layer 58, the hard mask 17, and the cap layer 16 are planarized by CMP (Chemical Mechanical Polishing), etc. to completely remove the insulating layer 58, the hard mask 17, and the cap layer 16 over the first magnetization pinning layer 19 and the second magnetization pinning layer. With the procedures described above, the first magnetization pinning layer 19 and the second magnetization pinning layer 20 are formed as shown in FIG. 4I.

In the second magnetization pinning layer 20, the hard mask 17 over the ferromagnetic film 18 as the constituent material thereof is etched when compared with the first magnetization pinning layer 19 in FIG. 4B to FIG. 4C. Therefore, the coercive force (Hc) of the second magnetization pinning layer 20 is smaller compared with the coercive force Hc of the first magnetization pinning layer 19 as to be described later. That is, two magnetization pinning layers 19, 20 of different coercive forces (Hc) can be obtained though the shapes are identical (FIG. 4E: pattern for resist mask 62) and the materials are also identical (FIG. 4A: ferromagnetic film 18).

The subsequent steps are as described below although they are not illustrated. At first, a film for the magnetic recording layer 10, a film for the tunnel barrier layer 11, and a film for the reference layer 12 are deposited continuously over the first magnetization pinning layer 19 and the second magnetization pinning layer 20 by sputtering or the like, and the reference layer 12 and the magnetic recording layer 10 of a desired shape are formed by ion milling, etc. Thus, the first magnetization pinning layer 19 and the first magnetization pinned region 1 of the magnetic recording layer 10 are connected electrically and magnetically, and the second magnetization pinning layer 20 and the second magnetization pinned region 3 of the magnetic recording layer 10 are connected electrically and magnetically. Further, also the portion to form the reference layer 12 and the tunnel barrier layer 11 is planarized to decrease the surface roughness. Thus, a desired memory device portion 72 (magnetoresistance effect device 71) as shown in FIG. 3A can be formed. In this case, when the shape as shown in FIG. 3B is formed, the magnetic recording layer 10 is formed such that the shape of the first magnetization pinned region 1 and that of the second magnetization pinned region 2 are identical in the step of forming the magnetic recording layer 10. Further, in a case of forming the shape as shown in FIG. 3C, the magnetic recording layer 10 is formed such that the first magnetization pinned region 1 and the second magnetization pinned region 2 are in an identical shape, the end of the first magnetization pinned region 1 and that of the first magnetization pinning layer 19 are aligned, and the end for the second magnetization pinned region 2 and that of the second magnetization pinning layer 20 are aligned.

Figure 5:
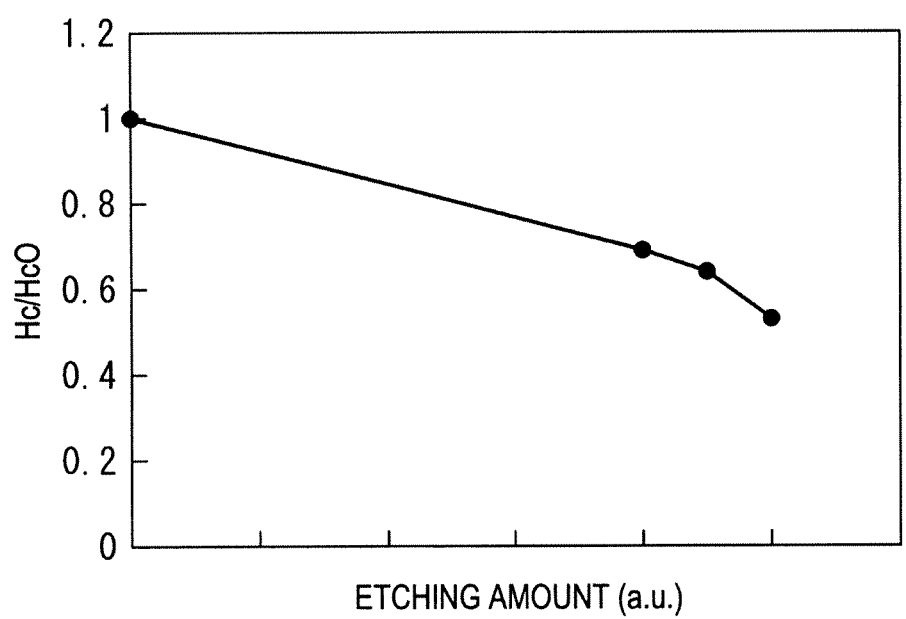
FIG. 5 is a graph showing a relation between the etching amount of a hard mask and the coercive force of a magnetization pinning layer.

The relation between the etching amount for the hard mask and the coercive force of the magnetization pinning layer is to be described. FIG. 5 is a graph showing a relation between the etching amount of the hard mask and the coercive force of the magnetization pinning layer. The abscissa denotes an etching time for the hard mask. The ordinate denotes a coercive force of the magnetization pinning layer (ferromagnetic film). The abscissa is represented by an arbitrary unit. The coercive force on the ordinate shows a relative ratio (Hc/Hc0) of the coercive force (Hc) after etching to the coercive force (Hc0) when the hard mask is not etched. Accordingly, it can be considered that the graph shows the relative ratio of the coercive force of the second magnetization pinning layer 20 to the coercive force of the first magnetization pinning layer 19. As shown in FIG. 5, it can be seen that the coercive force Hc of the magnetization pinning layer is lowered as the etching time increases. In the graph, the measuring point for the longest etching tame shows a case where the cap layer 16 is exposed.

It is to be noted for FIG. 4B to FIG. 4C that only the hard mask 17 is etched and the ferromagnetic film 18 (material for the second magnetization pinning layer 20) therebelow is not etched. That is, the thickness of the second magnetization pinning layer 20 is identical with the thickness of the first magnetization pinning layer 19 and the material for the second magnetization pinning layer 20 is identical with the material for the magnetization pinning layer 19. However, as shown in the graph, the difference can be provided for the coercive force (Hc) by the etching for the hard mask 17 thereover. In the example of this graph, the coercive force of the second magnetization pinning layer 20 can be lowered as far as one-half of the coercive force of the magnetization pinning layer 19. This can provide the first magnetization pinning layer 19 and the second magnetization pinning layer 20 of different coercive force (Hc) without any direct action or processing to the ferromagnetic film 18 (material for the second magnetization pinning layer 20).

The reason why the coercive force of the ferromagnetic film 18 (second magnetization pinning layer 20) below the hard mask 17 is lowered is considered to be attributable that the crystal magnetic anisotropy of the ferromagnetic film 18 is changed by the effect of the etching damage to the hard mask 17 or the cap layer 16 (stress strain).

FIG. 5 shows an example of predetermined type and thickness of the hard mask 17 and condition for reactive ion etching. The type and the thickness of the hard mask 17 and the condition for the reactive ion etching can be determined depending on the extent of the coercive force (Hc) of the ferromagnetic film (18), (the second magnetization pinning layer 20) below the hard mask 17, or depending on the extent of the ratio of the coercive force between the second magnetization pinning layer 20 and the first magnetization pinning layer 19. For example, when the type and the thickness of the hard mask 17 are identical and the reaction gas and supplied power are identical, the coercive force can be changed depending on the etching time. Further, the coercive force can be changed also by the reaction gas or the supplied power. Further, when etching is performed till the hard mask 17 is removed entirely, the coercive force can be changed depending on the thickness and the type of the hard mask 17. They can be attained by previously determining the relation between the conditions and the coercive force by experiment.

Then, an initialization (introduction of magnetic domain wall) method for the magnetoresistance effect device according to the first embodiment is to be described with reference to FIG. 3A. In the memory device portion 72 (magnetoresistance effect device 71), magnetization of the first magnetization pinned region 1, the magnetization reversal region 2, and the second magnetization pinned region 3 of the magnetic recording layer 10, and magnetization of the first magnetization pinning layer 19 and the second magnetization pinning layer 20 are at first directed to the direction +z by applying an external magnetic field (H1) in the direction +z. Then, for forming the magnetic domain wall in the magnetic recording layer 10, an external magnetic field H2 is applied in the direction −z. The magnetic field H2 applied in this case is set about to such a magnitude as reversing the magnetization of the magnetization reversal region 2, the second magnetization pinned region 3, and the second magnetization pinning layer 20 but not reversing the magnetization of the first magnetization pinned region 1 and the first magnetization pinning layer 19. It is to be noted herein that the coercive force (Hc) of the first magnetization pinning layer 19 is larger than that of the second magnetization pinning layer 20. By the application of the external magnetic field H2, the first magnetization pinned region 1 of the magnetic recording layer 10 forms one magnetic domain, and another portion of the magnetic recording layer 10 fauns another magnetic domain by the application of the external magnetic field H2. That is, a magnetic domain wall is formed at a portion corresponding to the first boundary 21 as the boundary between first magnetization pinned region 1 and the magnetization reversal region 2. As described above, in this embodiment, since the coercive force of the first magnetization pinning layer 19 and the coercive force of the second magnetization pinning layer 20 are different, initialization (introduction of magnetic domain wall) is attained easily.

Then, data write operation/read operation in the memory device portion according to the first embodiment is to be described with reference to FIG. 3A. In the following description, it is to be described assuming that the state where the magnetization of the magnetization reversal region 2 is directed to the direction −z and the magnetic domain wall is situated at the first boundary 21 is corresponded to data "1", and a state where the magnetization of the magnetization reversal region 2 is directed in the direction +z and the magnetic domain wall is situated at the second boundary 22 is corresponded to data "0" respectively. However, it will be apparent to a person skilled in the art that the correspondence between the direction of magnetization and the value of data may also be inverted.

The data write method is to be described. When data "1" is written into the magnetic recording layer 10 where the data "0" has been written, a write current flows from the first wirings 31 through the first contact via 32 and from the first magnetization pinning layer 19 in the magnetic recording layer to the first magnetization pinned region 1, the magnetization reversal region 2, and the second magnetization pinned region 3 successively, and, further, flows through the second magnetization pinning layer 20 and the second contact via 33 to the second wirings 34. When the write current is supplied, spin polarized electrons are injected from the second magnetization pinned region 3 to the magnetization reversal region 2. In this case, the magnetic domain wall at the first boundary 21 moves to the second boundary 22 by the spin transfer effect. That is, the direction of the magnetization in the magnetization reversal region 2 is switched from the direction +z to the direction −z.

When data "0" is written into the magnetic recording layer 10 where data "1" has been written, a write current flows from the second wirings 34 through the second contact via 33 and from the second magnetization pinning layer 20 in the magnetic recording layer to the second magnetization pinned region 3, the magnetization reversal region 2, and the first magnetization pinned region 1 successively and, further, flows through the first magnetization pinning layer 19 and the first contact via 32 to the first wirings 31. By the flow of the write current, spin polarized electrons are injected from the first magnetization pinned region 1 to the magnetization reversal region 2. In this case, the magnetic domain wall at the first boundary 21 moves to the second boundary 22 by the spin transfer effect. That is, the direction of magnetization in the magnetic reversal region 2 is switched from the direction −z to the direction +z.

Then, the data read operation is to be described. A TMR effect is utilized for reading data recorded in the magnetic recording layer 10. Upon reading the data, a read current is supplied so as to flow between the reference layer 12 and the magnetization reversal region 2. For example, the current flows from the first magnetization pinned region 1 or the second magnetization pinned region 3 by way of the magnetization reversal region 2 and the tunnel barrier layer 11 to the reference layer 12 and, further, flows to read wirings (not illustrated) formed over the reference layer 12. Alternatively, the read current flows from the read wirings through the reference layer 12 and by way of the tunnel barrier layer 11 and the magnetization reversal region 2 to the first magnetization pinned region 1 or the second magnetization pinned region 3. Based on the read current or the read potential, the resistance value of the magnetoresistance effect device 71 is detected and the magnetization direction of the magnetization reversal region 2, that is, data recorded in the magnetic recording layer 10 is distinguished.

As has been described above according to this embodiment, two magnetization pinning layers 19, 20 of different coercive forces can be manufactured although the shape and the material are identical by an extremely easy stable method of reactive ion etching in the process of manufacturing a memory device portion 72 (magnetoresistance effect device 71). Thus, a magnetic domain wall can be introduced (initialized) stably and easily to the magnetic recording layer 10. Accordingly, since it is no more necessary to manufacture two magnetization pinning layers 19, 20 of different materials or different shapes upon manufacture, the manufacturing cost can be saved. In addition, since the coercive force is made different between the two magnetization pinning layers 19, 20 by using a highly reliable process of the reactive ion etching to the hard mask 17, the reliability can be improved.

Second Embodiment

A magnetic domain moving type MRAM according to a second embodiment of the invention is to be described. This embodiment is different from the first embodiment in a portion of steps for the method of manufacturing the magnetic domain wall moving type MRAM. A manufacturing method for the magnetic domain wall moving type MRAM different from the first embodiment is to be described while saving the explanation for the matters identical with those of the first embodiment.

The method of manufacturing the magnetic domain moving type MRAM according to the second embodiment of the invention is to be described. FIG. 6A to FIG. 6I are cross sectional views showing the flow for the method of manufacturing the magnetic domain wall moving type MRAM according to the second embodiment of the invention.

Figure 6A:
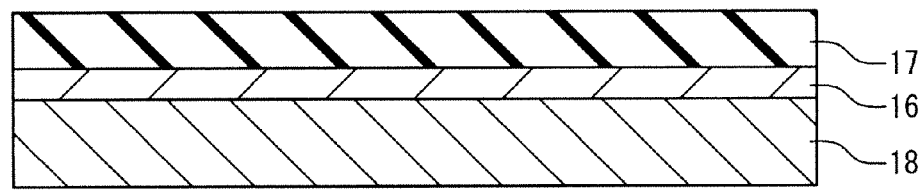
FIG. 6A is a cross sectional view showing a flow of a method of manufacturing a magnetic domain wall moving type MRAM according to a second embodiment of the invention.
Figure 6B:
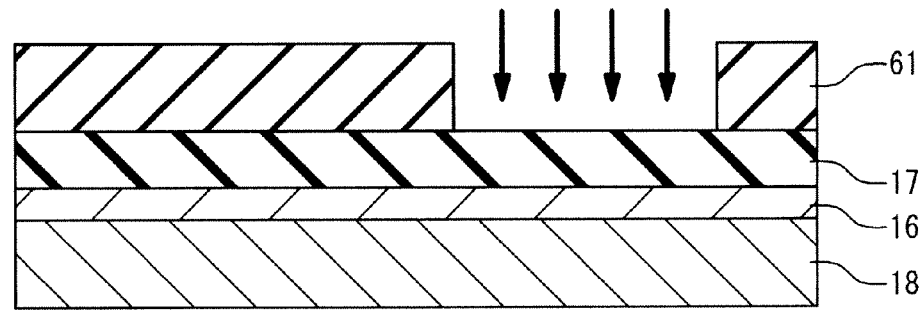
FIG. 6B is a cross sectional view showing a flow of a method of manufacturing a magnetic domain wall moving type MRAM according to the second embodiment of the invention.
Figure 6C:
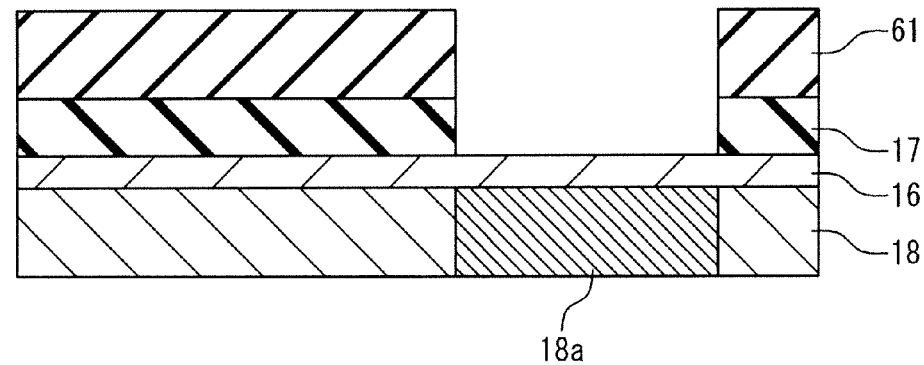
FIG. 6C is a cross sectional view showing a flow of a method of manufacturing a magnetic domain wall moving type MRAM according to the second embodiment of the invention.

Since the formation of the first wirings 31, the second wirings 34, the first contact via 32, and the second contact via 33 is identical with that of the first embodiment (not illustrated), explanation therefor is omitted. Further, since FIG. 6A to FIG. 6C are identical with the case of FIG. 4A to FIG. 4C for the first embodiment, their explanation is omitted. In FIG. 6C, while a hard mask 17 is etched entirely, the hard mask 17 may be left partially as shown in FIG. 4C. By the etching for the hard mask 17 in the step in FIG. 6B, the coercive force (Hc) of the ferromagnetic film 18 below the etched hard mask 17 is lowered.

Figure 6D:
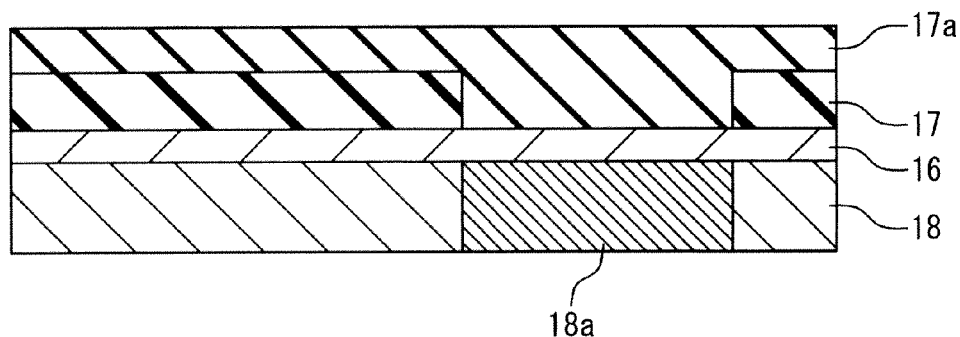
FIG. 6D is a cross sectional view showing a flow of a method of manufacturing a magnetic domain wall moving type MRAM according to the second embodiment of the invention.

Then, as shown in FIG. 6D, after peeling the resist mask 61, a silicon oxide ($SiO_2$) film is stacked as a hard mask 17a and planarized by CMP (Chemical Mechanical Polishing), etc. By planarization, when the hard masks 17, 17a are etched in the subsequent step (FIG. 6F), the thickness of the hard mask on the region where the magnetization pinning layer 19 is formed and the region where the magnetization pinning layer 20 is formed can be made identical. However, it is not essential in the invention that the thickness of the hard mask identical.

Figure 6E:
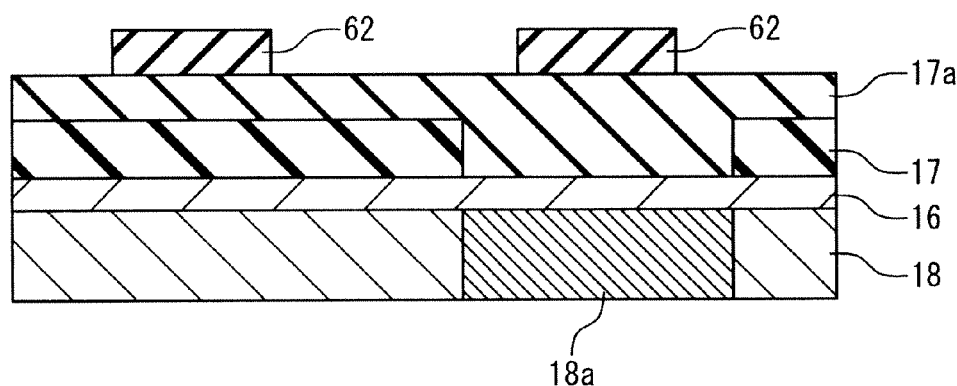
FIG. 6E is a cross sectional view showing a flow of a method of manufacturing a magnetic domain wall moving type MRAM according to the second embodiment of the invention.

Successively, as shown in FIG. 6E, a resist mask 62 for etching the hard masks 17, 17a is formed. A pattern for patterning the magnetization pinning layers 19, 20 is formed to the resist mask 62. That is, the resist mask 62 has a mask pattern capable of forming both of the magnetization pinning layers 19 and 20. The pattern is such that patterns for the magnetization pinning layers 19 and 20 are in an identical shape.

Figure 6F:
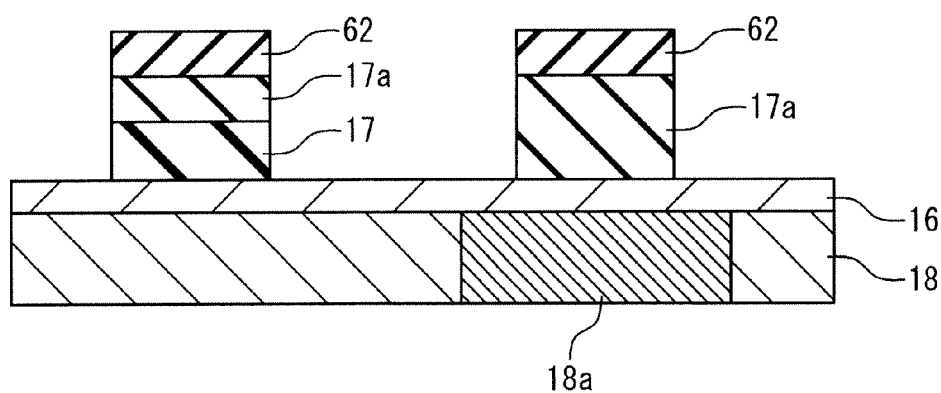
FIG. 6F is a cross sectional view showing a flow of a method of manufacturing a magnetic domain wall moving type MRAM according to the second embodiment of the invention.

Successively, as shown in FIG. 6F, the hard masks 17, 17a are etched by using the resist mask 62 by the method, for example, of reactive ion etching. In this process, the thickness of the hard mask 17 stacked over the ferromagnetic layer film 18 is identical between the region where the first magnetization pinning layer 19 is formed and a region where the second magnetization pinning layer 20 is formed. Therefore, etching for the hard masks 17, 17a can be controlled easily.

Figure 6G:
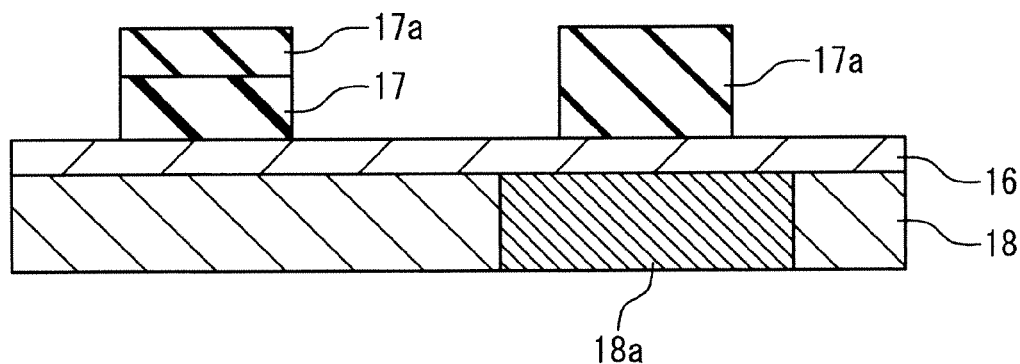
FIG. 6G is a cross sectional view showing a flow of a method of manufacturing a magnetic domain wall moving type MRAM according to the second embodiment of the invention.
Figure 6H:
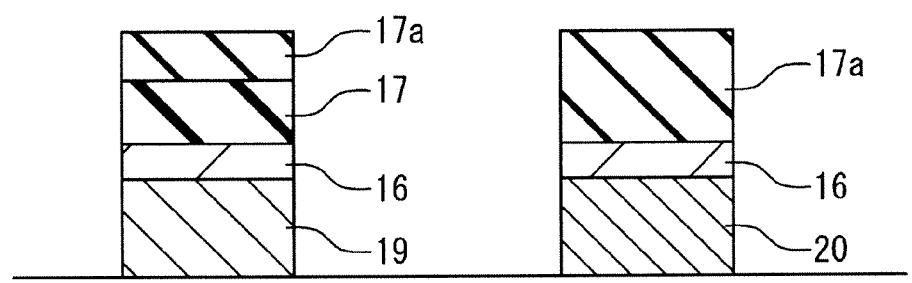
FIG. 6H is a cross sectional view showing a flow of a method of manufacturing a magnetic domain wall moving type MRAM according to the second embodiment of the invention.
Figure 6I:
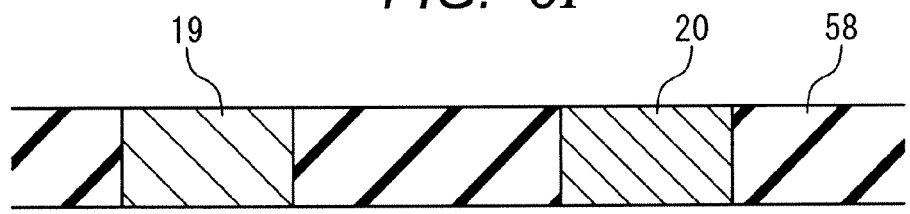
FIG. 6I is a cross sectional view showing a flow of a method of manufacturing a magnetic domain wall moving type MRAM according to the second embodiment of the invention.

Since the subsequent steps from FIG. 6G to FIG. 6I and the steps up to FIG. 3A are identical with the steps from FIG. 4G to FIG. 4I and the steps up to FIG. 3A in the first embodiment, their explanations are to be omitted. Thus, a desired memory device portion 72 (magnetoresistance effect device 71) as shown in ¥FIG. 3A can be formed.

Also for this embodiment, the same effect as that in the first embodiment can be obtained. In addition, etching for the hard mask can be controlled easily in the etching step shown in FIG. 6F.

Third Embodiment

A magnetic domain moving type MRAM according to a third embodiment of the invention is to be described. This embodiment is different from the first embodiment for a portion of steps for the method of manufacturing the magnetic domain wall moving type MRAM. In the followings, the manufacturing method for the magnetic domain wall moving type MRAM is to be described, and the portion is different from the first embodiment while saving the explanation for other portions identical with those of the first embodiment.

The method of manufacturing the magnetic domain of moving type MRAM according to the third embodiment of the invention is to be described. FIG. 7A to FIG. 7G are cross sectional views showing a flow for the method of manufacturing the magnetic domain wall moving type MRAM according to the third embodiment of the invention.

Figure 7A:
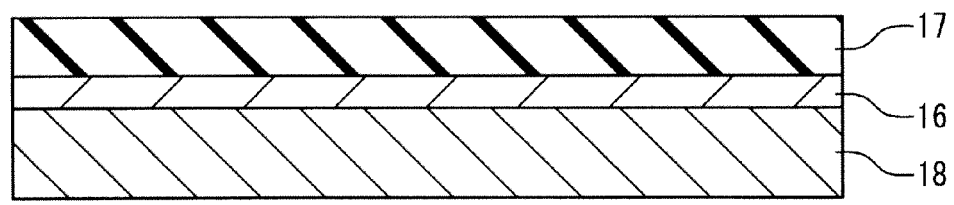
FIG. 7A is a cross sectional view showing a flow of a method of manufacturing a magnetic domain wall moving type MRAM according to a third embodiment of the invention.

Since the formation of the first wirings 31, the second wirings 34, first contact via 32, and the second contact via 33 is identical with that of the first embodiment (not illustrated), explanation therefor is omitted. Further, since FIG. 7A is identical with the case of FIG. 4A of the first embodiment, the explanation is to be omitted.

Figure 7B:
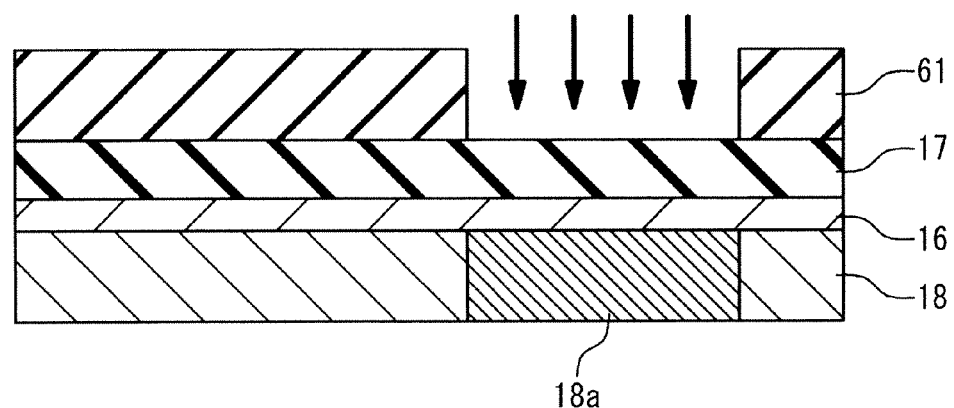
FIG. 7B is a cross sectional view showing a flow of a method of manufacturing a magnetic domain wall moving type MRAM according to the third embodiment of the invention.
Figure 7C:
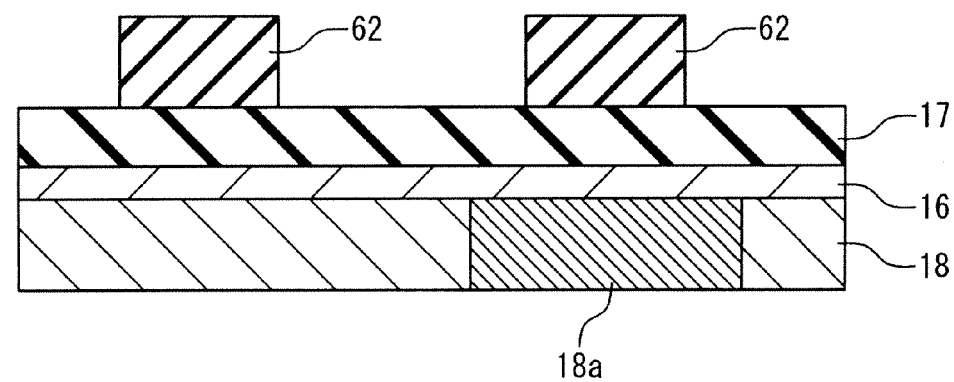
FIG. 7C is a cross sectional view showing a flow of a method of manufacturing a magnetic domain wall moving type MRAM according to the third embodiment of the invention.
Figure 7D:
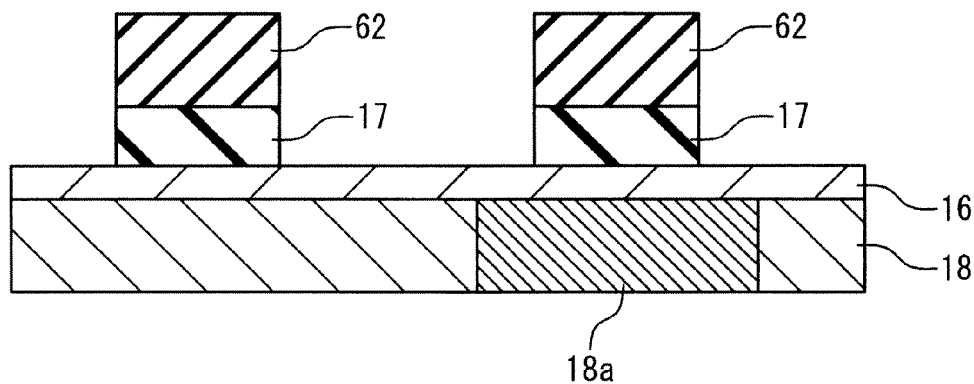
FIG. 7D is a cross sectional view showing a flow of a method of manufacturing a magnetic domain wall moving type MRAM according to the third embodiment of the invention.
Figure 7E:
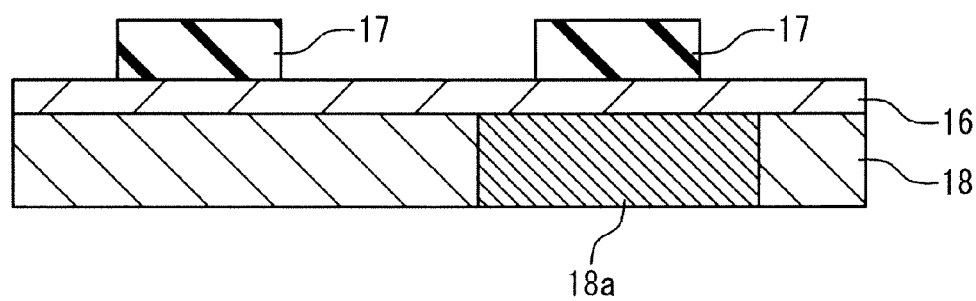
FIG. 7E is a cross sectional view showing a flow of a method of manufacturing a magnetic domain wall moving type MRAM according to the third embodiment of the invention.
Figure 7F:
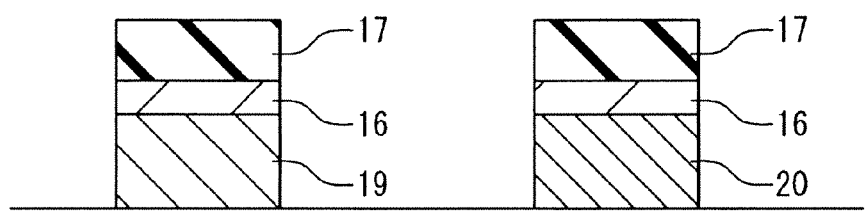
FIG. 7F is a cross sectional view showing a flow of a method of manufacturing a magnetic domain wall moving type MRAM according to the third embodiment of the invention.
Figure 7G:
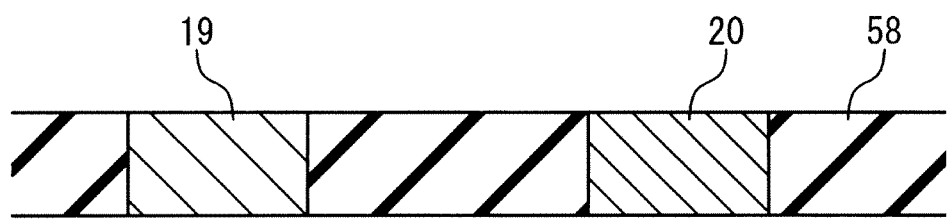
FIG. 7G is a cross sectional view showing a flow of a method of manufacturing a magnetic domain wall moving type MRAM according to the third embodiment of the invention.

Then, as shown in FIG. 7B, a resist mask 61 for implanting ions to a hard mask 17 is formed. A pattern that masks only the region of forming one of the magnetization pinning layers is formed to the resist mask 61. In FIG. 7B, the pattern masks the region for forming the first magnetization pinning layer 19. However, the pattern may be formed so as to mask the region of forming the opposite second magnetization pinning layer 20. The hard mask 17 is processed physically and chemically by using the resist mask 61. In this embodiment, ions are implanted by way of the resist mask 61 to the hard mask 17. By ion implantation to the hard mask 17, the coercive force (Hc) of the ferromagnetic film 18 below the ion implanted hard mask 17 is lowered as in the case reactive of the ion etching described above. It is to be noted that the film (layer) to be implanted with ions is not the ferromagnetic film 18 but the hard mask 17 and the cap layer 16.

For the ion implantation conditions, ion implantation conditions known so far, for example, of implanting ion species containing B into the silicon oxide film or the silicon nitride film can be used as they are. Based thereon, in accordance with the amount of change intended to be given to the coercive force Hc of the ferromagnetic film 18, the ion implantation conditions are changed and selected appropriately. The extent of lowering the coercive force Hc to the ion implantation conditions can be recognized by previously determining the relation between the conditions and the coercive force by an experiment.

Since the subsequent steps from FIG. 7C to FIG. 7G and the steps up to FIG. 3A are identical with the steps of FIG. 4D to FIG. 4I and the steps up to FIG. 3A in the first embodiment, their explanation is to be omitted. Thus, a desired memory device portion 71 (magnetoresistance effect device 71) as shown in FIG. 3A can be formed.

When the second magnetization pinning layer 20 is compared with the first magnetization pinning layer 19, ions are implanted to the hard mask 17 on the ferromagnetic film 18 as the constituent material therefor. Accordingly, in the same manner as in the reactive etching described above, the coercive force (Hc) of the second magnetization pinning layer 20 is lowered compared with the coercive force (Hc) of the first magnetization pinning layer 19. It is to be noted that ions are implanted only to the hard mask 17 and not implanted to the ferromagnetic film 18 (second magnetization pinning layer 20) therebelow in FIG. 7B. That is, the thickness of the second magnetization pinning layer 20 is identical with the thickness of the first magnetization pinning layer 19 and they are formed of an identical material. That is, two magnetization pinning layers 19, 20 of different coercive force (Hc) can be obtained although the shape is identical and the material is also identical.

The reason why the coercive force of the ferromagnetic film 18 (second magnetization pinning layer 20) below the hard mask is lowered is considered to be attributable to that since ion implantation damages to the hard mask 17 or the cap layer 16 (stress strain, etc.) exert on the ferromagnetic film 18, the ferromagnetic film 18 undergoes denaturation and the crystal magnetic anisotropy of the ferromagnetic layer 18 is changed in the same manner as that in the first embodiment.

Also in this embodiment, the same effect as that in the first embodiment can be obtained by an extremely easy and stable method of ion implantation to the hard mask 17 on the ferromagnetic layer 18.

In each of the embodiments described above, the material and the shape for the two magnetization pinning layers 19, 20 are made identical in order to make the effect clearer. However, since the coercive force of one of the magnetization pinning layers can be lowered (the extent of the coercive force can be controlled) by using the manufacturing method described above, it is the method cannot not always necessary that the pinning layers are formed of an identical material and an in identical shape. For example, the coercive force of the second magnetization pinning layer 20 can be lowered to less than the coercive force of the first magnetization pinning layer 19 irrespective of the shape and the material by lowering the coercive force (Hc) of the second magnetization pinning layer 20 by the method described above in the manufacturing step although the shape and the material are different between the two magnetization pinning layers 19 and 20. As a result, also the initialization in the magnetoresistance effect device (introduction of magnetic domain wall) can be conducted extremely easily as described above.

Further, in each of the embodiments described above, reactive ion etching to the hard mask 17 or ion implantation to the hard mask 17 is performed as the physical and chemical processing to the hard mask 17. However, two magnetization pinning layer 19, 20 of different coercive forces (Hc) can be obtained also by using the plasma radiation, ion radiation, electron beam radiation, etc. to the hard mask as the physical and chemical processing to the hard mask 17 depending on the conditions.

It will be apparent that the present invention is not restricted to each of the embodiments described above but each of the embodiments can be modified or changed appropriately within a range of the technical concept of the present invention. Further, the technique used in each of the embodiments is applicable also in other embodiments so long as this does not cause confliction.

What is claimed is:

1. A method of manufacturing a magnetic memory, the magnetic memory having a magnetic recording layer as a ferromagnetic layer, a reference layer connected by way of a non-magnetic layer to the magnetic recording layer, and a first magnetization pinning layer and a second magnetization pinning layer disposed below the magnetic recording layer along a line normal to the film, the magnetic recording layer and the reference layer having a perpendicular magnetic anisotropy, the magnetic recording layer including a magnetization reversal region having a reversible magnetization and overlapping the reference layer, a first magnetization pinned region connected to a first boundary of the magnetization reversal region with the direction of magnetization being fixed in a first direction, and a second magnetization pinned region connected to a second boundary of the magnetization reversal region with the direction of magnetization being fixed in a second direction anti-parallel to the first direction, the first magnetization pinning layer and the second magnetization pinning layer fixing the magnetization in the first magnetization pinned region and the second magnetization pinned region respectively, and the coercive force of the second magnetization pinning layer being lower than that of the first magnetization pinning layer, the method of manufacturing the magnetic memory comprising:

forming a film for the magnetization pinning layer;

forming a hard mask over the film for the magnetization pinning layer;

forming a protective film so as to cover the hard mask stacked over a region in the film for the magnetization pinning layer other than the region of forming the second magnetization pinning layer;

processing the hard mask using the protective film as a mask;

patterning the hard mask after removing the protective film; and patterning the film for the magnetization pinning layer using the patterned hard mask as a mask, thereby forming the first magnetization pinning layer and the second magnetization pinning layer.

2. The method of manufacturing a magnetic memory according to claim 1, wherein the step of processing the hard mask includes a step of etching the hard mask using the protective film as a mask.

3. The method of manufacturing a magnetic memory according to claim 2, wherein the step of forming the first magnetization pinning layer and the second magnetization pinning layer includes a step of patterning the first magnetization pinning layer and the second magnetization pinning layer into an identical shape.

4. The method of manufacturing a magnetic memory according to claim 1, wherein the step of processing the hard mask includes a step of implanting ions to the hard mask using the protective film as a mask.

5. The method of manufacturing a magnetic memory according to claim 1, wherein the film for the magnetization pinning layer includes a ferromagnetic body having a perpendicular magnetic anisotropy.

6. The method of manufacturing a magnetic memory according to claim 1, wherein the step of processing the hard mask includes a step of processing such that the thin film of the hard mask remains on the film for the magnetization pinning layer.

7. The method of manufacturing a magnetic memory according to claim 1, further comprising:

forming the magnetic recording layer such that the first magnetization pinned region and the second magnetization pinned region are in an identical shape, the end of the first magnetization pinned region and that of the first magnetization pinning layer are aligned, and the end of the second magnetization pinned region and that of the second magnetization pinning layer are aligned.

* * * * *